(12) United States Patent
Shin

(10) Patent No.: US 8,329,550 B2
(45) Date of Patent: Dec. 11, 2012

(54) METHOD OF FABRICATING TRANSISTOR FOR SEMICONDUCTOR DEVICE

(75) Inventor: Min-Jung Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/277,751

(22) Filed: Oct. 20, 2011

(65) Prior Publication Data

US 2012/0034748 A1     Feb. 9, 2012

Related U.S. Application Data

(62) Division of application No. 12/492,939, filed on Jun. 26, 2009, now Pat. No. 8,062,948.

(30) Foreign Application Priority Data

Dec. 29, 2008    (KR) .................. 10-2008-0135584

(51) Int. Cl.
    *H01L 21/336*    (2006.01)
(52) U.S. Cl. ........ 438/303; 438/299; 438/300; 438/301; 257/408

(58) Field of Classification Search .................. 257/190, 257/288, 304, 327, 368, 408; 438/198, 233, 438/296, 299, 300, 413, 303
See application file for complete search history.

(56) References Cited

U.S. PATENT DOCUMENTS

| | | | |
|---|---|---|---|
| 6,541,343 B1 * | 4/2003 | Murthy et al. ............. | 438/299 |
| 7,335,959 B2 * | 2/2008 | Curello et al. ............. | 257/408 |
| 7,518,175 B2 * | 4/2009 | Kim et al. ................. | 257/304 |
| 7,670,923 B1 * | 3/2010 | Nayak et al. .............. | 438/413 |
| 7,696,052 B2 * | 4/2010 | Wei et al. ................. | 438/300 |
| 7,936,006 B1 * | 5/2011 | Luo et al. ................. | 257/327 |
| 2008/0132019 A1 * | 6/2008 | Ku et al. .................. | 438/300 |

* cited by examiner

*Primary Examiner* — Zandra Smith
*Assistant Examiner* — Errol Fernandes
(74) *Attorney, Agent, or Firm* — IP & T Group LLP

(57) ABSTRACT

A method of fabricating a transistor in a semiconductor device includes forming a gate structure over a substrate, forming a first trench by etching the substrate on either side of the gate structure to a first depth, ion-implanting dopants of a first conductivity type to form a source/drain region in the substrate on the side of the gate structure with the first trench, etching the substrate on the side of the gate structure with the first trench to a second depth larger than the first depth to form a second trench, and growing an epitaxial layer within the second trench.

5 Claims, 7 Drawing Sheets

METHOD OF FABRICATING TRANSISTOR FOR SEMICONDUCTOR DEVICE

CROSS-REFERENCE TO RELATED APPLICATIONS

This application is a division of U.S. patent application Ser. No. 12/492,939 filed on Jun. 26, 2009 now U.S. Pat. No. 8,062,948 which claims priority of Korean patent application number 10-2008-0135584, filed on Dec. 29, 2008. The disclosure of each of the foregoing applications is incorporated herein by reference in its entirety.

BACKGROUND OF THE INVENTION

The present invention relates to a semiconductor fabrication technology, and more particularly, to a method of fabricating a transistor for use in a semiconductor device.

As semiconductor devices are being highly integrated, one of important issues is to fabricate transistors that can ensure a high current drivability and a short channel margin even at small dimensions.

Recently, extensive studies have been conducted to increase carrier mobility in order to ensure a high current drivability. Carrier mobility may be increased by applying a certain stress to a channel region defined under a gate, leading to improving current characteristic of transistors. To this end, various transistor structures and fabrication methods thereof have been proposed, and one such example is illustrated in FIGS. 1A to 1D.

FIGS. 1A to 1D are cross-sectional views explaining a structure of a conventional PMOS transistor and a fabrication method thereof.

Referring to FIG. 1A, a device isolation layer 11 is formed on a substrate 10 to define an active region.

A gate pattern 12 having a stacked structure of a gate insulation layer, a gate electrode and a gate hard mask is formed on the substrate 10, and a gate spacer 13 is formed on a sidewall of the gate pattern 12.

Referring to FIG. 1B, the substrate 10 on either side of the gate spacer 13 is etched to a certain depth to form a trench T. Reference numeral 11A represents an etched device isolation layer.

Referring to FIG. 1C, an epitaxial layer 14 is grown within the trench T by using a sidewall and/or bottom of the trench T as a seed layer.

The epitaxial layer 14 is used to apply a stress to the channel region of the substrate 10. In the case of the PMOS transistor, a compression stress is applied in a direction parallel to the channel region in order to increase the mobility of majority carriers, i.e., holes. Thus, the epitaxial layer 14 is formed of a material having a larger lattice constant than the substrate 10. For example, when the substrate 10 is a Si substrate, the epitaxial layer 14 may be a SiGe epitaxial layer.

Referring to FIG. 1D, an initial source/drain region 15 is formed by ion implantation of P-type dopants such as boron (B).

Referring to FIG. 1E, a thermal treatment is performed for dopant activation. As a result, the dopants are diffused to form a final source/drain region 15A. In this manner, a PMOS transistor having a structure of FIG. 1E is completed.

However, there are the following limitations on the structure of the conventional PMOS transistor and the fabrication method thereof.

When the epitaxial layer 14 such as SiGe is grown, it is grown not uniformly but in a convex shape (see FIGS. 1C to 1E). Due to the shape of the epitaxial layer 14, the dopants for forming the source/drain region in a subsequent process are relatively more ion-implanted into edges of the gate pattern 12 than other positions (see FIG. 1D). From the profile of the final source/drain region 15A when the dopants are diffused by the subsequent thermal treatment, it can be seen that lateral diffusion of the dopants is so active that the side of the final source/drain region 15A penetrates even under the gate pattern 12, whereas the bottom of the final source/drain region 15A is relatively shallow.

If the side of the final source/drain region 15A penetrates even under the gate pattern 12, the short channel margin of the transistor is degraded and, in particular, Drain Induced Barrier Lowering (DIBL) is degraded.

Furthermore, if the bottom of the final source/drain region 15A is shallow, leakage current characteristic is degraded due to interface defect between the substrate 10 and the epitaxial layer 14.

Therefore, there is a need for a method of fabricating a new transistor capable of solving the above-mentioned limitations.

SUMMARY OF THE INVENTION

Embodiments of the present invention are directed to providing a method of fabricating a transistor for use in a semiconductor device. In the method, a source/drain region is formed before growth of an epitaxial layer. At this point, by forming the source/drain region in a state that a trench has been formed by etching a substrate, the source/drain region is sufficiently deep, and the overlap between the side of the source/drain region and a gate pattern is reduced, leading to improving a leakage current characteristic of the transistor and preventing a short channel effect.

In accordance with an aspect of the present invention, there is provided a method of fabricating a transistor for use in a semiconductor device. The method includes forming a gate structure over a substrate, forming a first trench by etching the substrate on either side of the gate structure to a first depth, ion-implanting dopants of a first conductivity type to form a source/drain region in the substrate on the side of the gate structure with the first trench, etching the substrate on the side of the gate structure with the first trench to a second depth larger than the first depth to form a second trench, and growing an epitaxial layer within the second trench.

In accordance with another aspect of the present invention, there is provided a method of fabricating a transistor for use in a semiconductor device. The method including: forming a first trench by etching a substrate on a side of a gate structure to a first depth, forming a material layer over the resulting substrate structure, etching the material layer to partially expose the substrate covered by the material layer and leave a continuous layer of the material spacer over a sidewall of the gate structure and an area of the first trench, and after forming a source/drain region underneath the first trench, etching the substrate underneath the first trench to a second depth larger than the first depth to form a second trench.

In accordance with another aspect of the present invention, there is provided a method of fabricating a transistor for use in a semiconductor device. The method including: forming an isolation layer defining an active region on a substrate, forming a gate structure over the substrate having the isolation layer, etching a portion of the active region between the gate structure and the isolation layer to form a first trench to a first depth, forming a material layer over the resulting substrate structure, etching the material layer to partially expose the substrate covered by the material layer and leave a discontinuous layer of the material spacer over a sidewall of the gate structure and a sidewall of the isolation layer, and after forming a source/drain region underneath the first trench, etching the substrate underneath the first trench to a second depth larger than the first depth to form a second trench.

DESCRIPTION OF SPECIFIC EMBODIMENTS

Figure 1A:
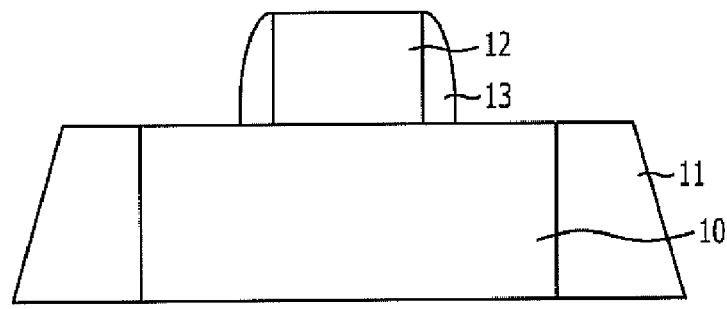
FIGS. 1A to 1E are cross-sectional views explaining a structure of a conventional PMOS transistor and a fabrication method thereof.
Figure 1B:
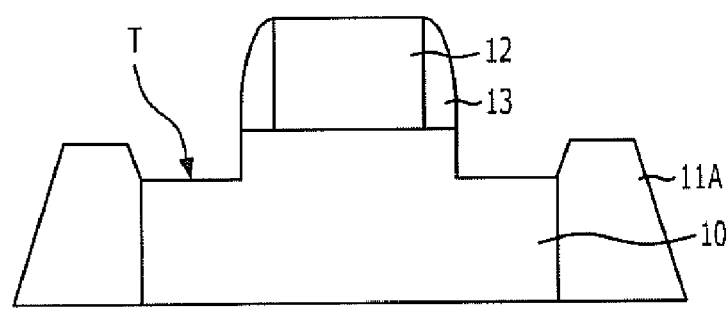
Figure 1C:
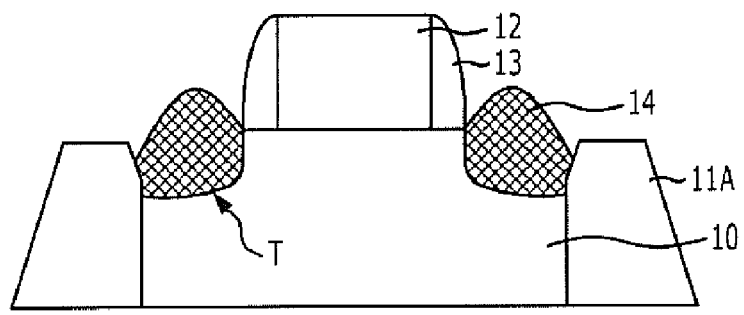
Figure 1D:
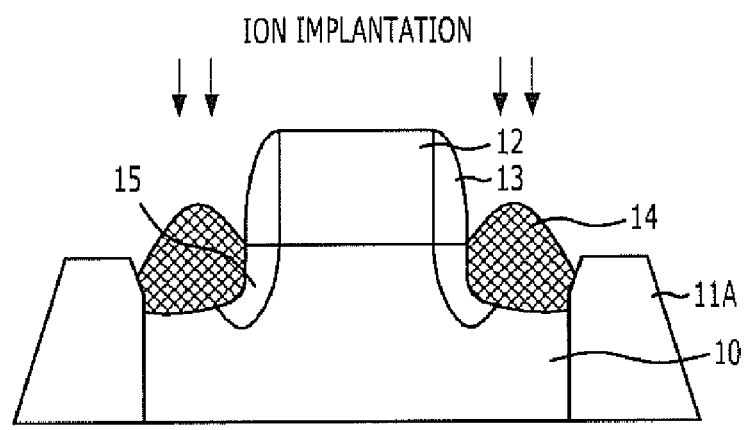
Figure 1E:
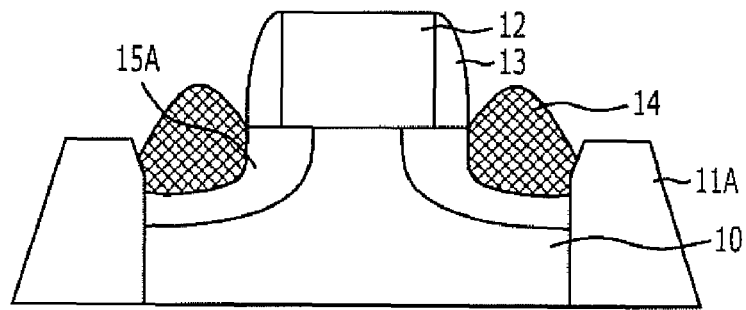

Other objects and advantages of the present invention can be understood by the following description, and become apparent with reference to the embodiments of the present invention.

Referring to the drawings, the illustrated thickness of layers and regions are exemplary only and may not be exact. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals represent the same or like constituent elements, although they appear in different embodiments or drawings of the present invention.

FIGS. 2A to 2H are cross-sectional views describing a method of fabricating a transistor in accordance with an embodiment of the present invention. In particular, a method of fabricating a PMOS transistor using epitaxial growth is illustrated in FIGS. 2A to 2H.

Figure 2A:
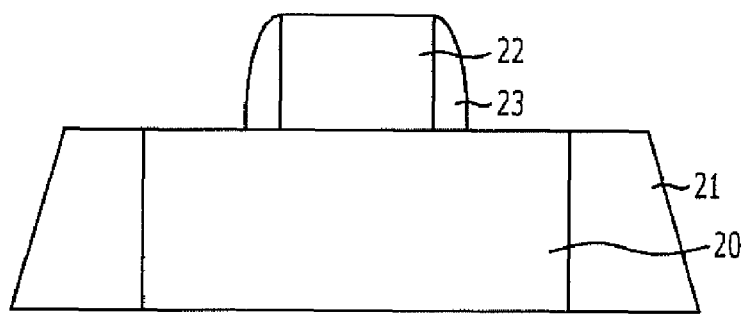
FIGS. 2A to 2H are cross-sectional views describing a method of fabricating a transistor for use in a semiconductor device in accordance with an embodiment of the present invention.

Referring to FIG. 2A, a device isolation layer 21 is formed on a substrate 20 to define an active region.

A gate pattern 22 having a stacked structure of a gate insulation layer, a gate electrode and a gate hard mask is formed on the substrate 20, and a gate spacer 23 is formed on a sidewall of the gate pattern 22.

Figure 2B:
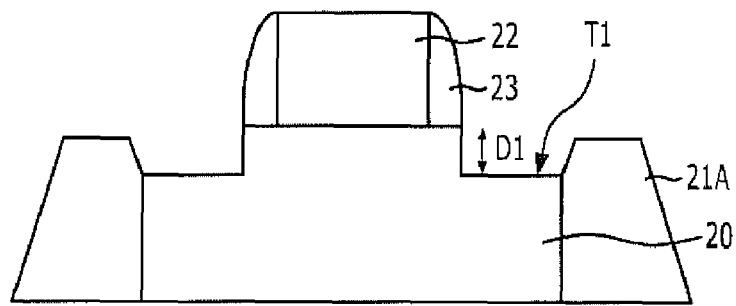

Referring to FIG. 2B, the substrate 20 on either side of the gate spacer 23 is etched to a first depth D1 to form a first trench T1. The first depth D1 may be in a range from about 50 Å to about 500 Å. Reference numeral 21A represents an etched device isolation layer.

The first trench T1 is formed for a subsequent source/drain region, whereas the trench T of the prior art is formed for growth of the epitaxial layer. The formation of the first trench T1 aims to improving leakage current characteristic caused by possible interface defect between the substrate 20 and a subsequent epitaxial layer by making the subsequent source/drain region sufficiently deep, which will be described later in detail.

Figure 2C:
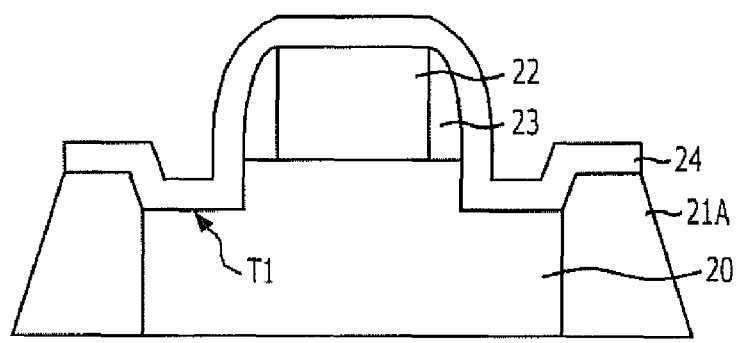
Figure 2D:
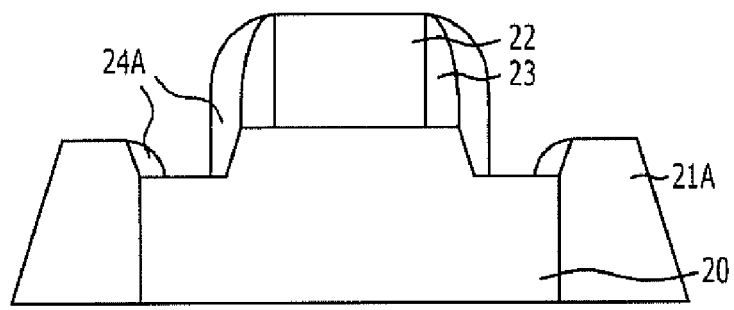

Referring to FIGS. 2C and 2D, a material layer 24 is formed over a resulting structure where the gate pattern 22, the gate spacer 23 and the first trench T1 are formed, and the material layer 24 is anisotropically etched to form a material spacer 24A on a sidewall of the first trench T1 and/or a sidewall of the gate spacer 23.

The material spacer 24A is additionally formed in order to reduce the penetration of the dopants under the gate pattern 22 after being diffused laterally when forming the subsequent source/drain region. This process may be omitted. The material spacer 24A may be formed of nitride.

Figure 2E:
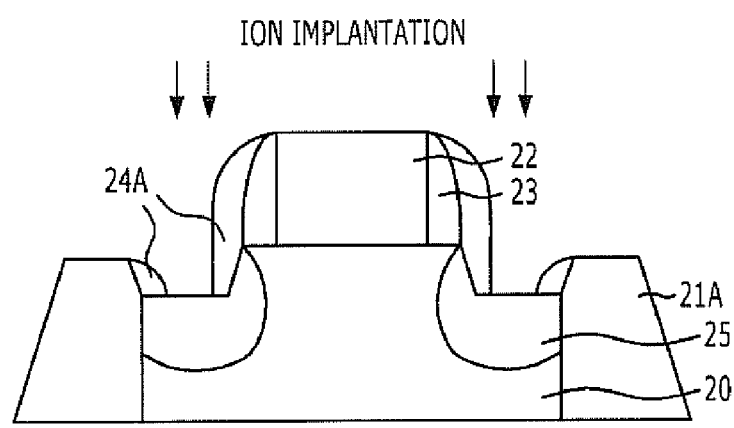

Referring to FIG. 2E, a source/drain region 25 is formed by ion-implanting P-type dopants such as boron (B) and performing a thermal treatment such as rapid thermal annealing (RTA) for dopant activation.

As described above, since the dopant ion-implantation for formation of the source/drain region 25 and the thermal treatment are performed on the substrate 20 where the first trench T1 is already formed, the source/drain region is sufficiently deeper than the channel region, leading to improved leakage current characteristic.

In the prior art, the source/drain region 15 is formed after an uneven epitaxial layer is grown. However, in accordance, with the embodiment of the present invention, the source/drain region 25 is formed, before the growth of the epitaxial layer, within the substrate 20 where the first trench T1 having a uniform depth is formed. Thus, compared with the prior art, the side of the source/drain region 25 penetrates, to a lesser extent, under the gate pattern 22. That is, the overlap between the gate pattern 22 and the source/drain region 25 is reduced. Therefore, a short channel margin of the transistor is improved, and in particular, DIBL is improved.

Figure 2F:
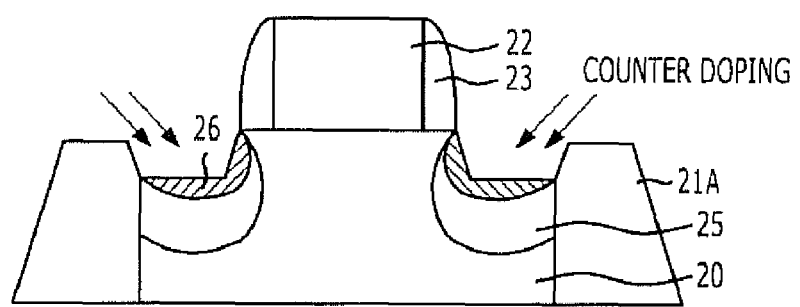

Referring to FIG. 2F, a remaining material spacer 24A is removed, and a counter doping region 26 is formed on the surface of the source/drain region 25 by performing a counter doping to tilted-ion-implant N-type dopants such as arsenic (As).

The process of forming the counter doping region 26 on the surface of the source/drain region 25 may be omitted.

Figure 2G:
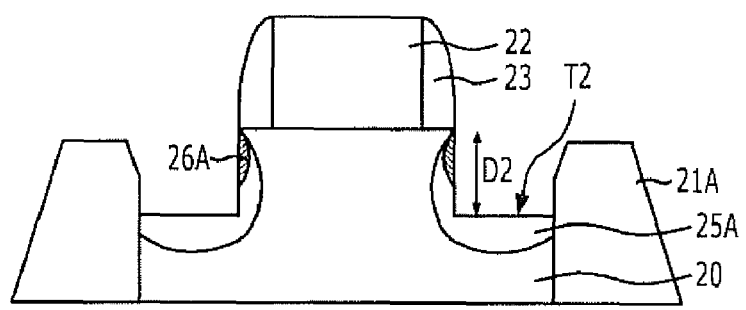

Referring to FIG. 2G, the substrate 20 on either side of the gate spacer 23, where the first trench T1 is formed, is etched to a second depth D2 to form a second trench T2 deeper than the first trench T1. The second depth D2 may be in a range from about 100 Å to about 1,000 Å, which is greater than the value of the first depth D1. Reference numerals 25A and 26A represent an etched side of the source-drain region and an etched counter doping region, respectively.

The second trench T2 is formed for growth of a subsequent epitaxial layer.

Figure 2H:
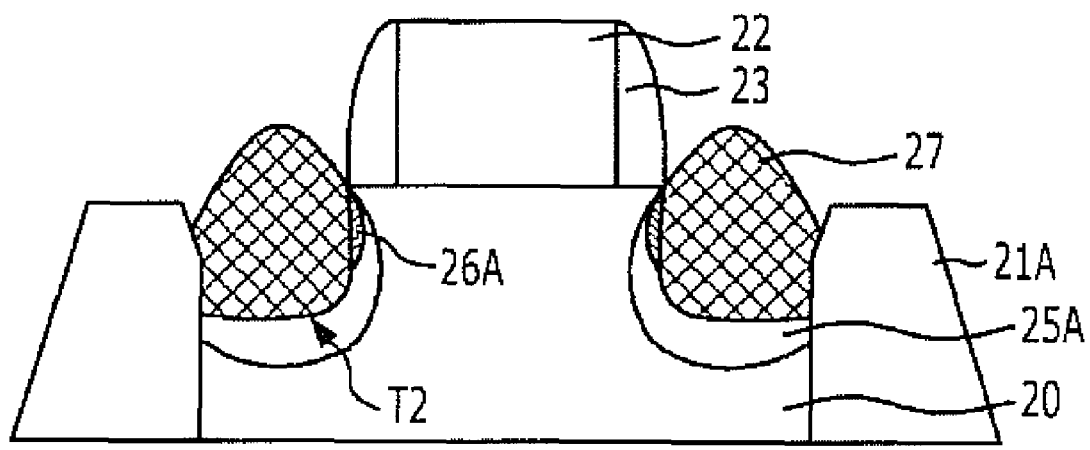

Referring to FIG. 2H, an epitaxial layer 27 is formed within the second trench T2 by using a sidewall and/or bottom of the second trench T2 as a seed layer. At this point, P-type impurities (for example, boron) for forming the etched source/drain region 25A are doped in-situ during the growth of the epitaxial layer 27.

The epitaxial layer 27 is used to apply a stress to the channel region of the substrate 20. In the case of the PMOS transistor, a compression stress is applied in a direction parallel to the channel region in order to increase the mobility of majority carriers, i.e., holes. Thus, the epitaxial layer 27 is formed of a material having a larger lattice constant than the substrate 20. For example, when the substrate 20 is a Si substrate, the epitaxial layer 27 may be a SiGe epitaxial layer.

Through the processes of FIGS. 2A to 2H, the overlap between the side of the source/drain region 25 and the gate pattern 22 is reduced while making the bottom of the source/drain region 25 sufficiently deep, thus improving leakage current characteristic of the transistor and preventing a short channel effect.

In the method of fabricating the transistor for use in the semiconductor device in accordance with the embodiment of the present invention, the source/drain region is formed before growth of the epitaxial layer. At this point, by forming the source/drain region in a state that the trench has been formed by etching the substrate, the source/drain region is sufficiently deep, and the overlap between the side of the source/drain region and the gate pattern is reduced, leading to improving the leakage current characteristic of the transistor and preventing the short channel effect.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a transistor in a semiconductor device, the method comprising:
   forming an isolation layer defining an active region on a substrate;
   forming a gate structure over the substrate having the isolation layer;
   etching a portion of the active region between the gate structure and the isolation layer to form a first trench to a first depth;
   after forming the first trench, forming a material layer over the resulting substrate structure;
   etching the material layer to partially expose the substrate covered by the material layer and leave a discontinuous layer of the material layer over a sidewall of the gate structure and a sidewall of the isolation layer;
   after etching the material layer, forming a source/drain region underneath the first trench; and
   after forming the source/drain region, etching the substrate underneath the first trench to a second depth larger than the first depth to form a second trench.

2. The method of claim 1, wherein the material layer comprises a nitride layer.

3. The method of claim 1, further comprising, after forming the source/drain region but before forming the second trench,
   tilted-ion-implanting dopants to form a counter doping region over the surface of the source/drain region.

4. The method of claim 1, wherein the transistor is a PMOS transistor.

5. The method of claim 1, further comprising growing an epitaxial layer within the second trench.

* * * * *